United States Patent
Ohtake

[19]

[11] Patent Number: 6,094,094
[45] Date of Patent: Jul. 25, 2000

[54] SEMICONDUCTOR INTEGRATED CIRCUIT HAVING BIAS CIRCUITS EACH INCLUDING DIFFERENT REFERENCE RESISTORS

[75] Inventor: Hisao Ohtake, Tokyo, Japan

[73] Assignee: Oki Electric Industry Co., Ltd., Tokyo, Japan

[21] Appl. No.: 09/182,423

[22] Filed: Oct. 30, 1998

[30] Foreign Application Priority Data

Oct. 31, 1997 [JP] Japan ..................................... 9-299801

[51] Int. Cl.[7] ........................................................ G06G 7/12
[52] U.S. Cl. .......................... 327/560; 561/563; 561/65; 561/66; 330/252; 330/253
[58] Field of Search .................... 330/252, 253, 330/254, 256, 257; 327/65, 66, 52, 53, 56, 560–566

[56] References Cited

U.S. PATENT DOCUMENTS

| | | | |
|---|---|---|---|
| 5,252,868 | 10/1993 | Miida et al. | 327/284 |
| 5,475,338 | 12/1995 | Yamaguchi | 327/552 |
| 5,818,295 | 10/1998 | Chimura et al. | 327/561 |
| 5,907,259 | 5/1999 | Yamada et al. | 327/563 |

FOREIGN PATENT DOCUMENTS

| | | |
|---|---|---|
| 7-038056 | 9/1995 | Japan . |
| 9-219629 | 9/1997 | Japan . |

*Primary Examiner*—Timothy P. Callahan
*Assistant Examiner*—An T. Luu
*Attorney, Agent, or Firm*—Venable; Robert J. Frank

[57] ABSTRACT

A semiconductor integrated circuit having bias circuits each including different reference resistor is disclosed. The semiconductor integrated circuit comprises a reference voltage generating circuit which outputs a reference voltage, a first bias circuit connected to the reference voltage generating circuit. The first bias circuit has a first reference load element formed of a first material and generates a first bias voltage. The semiconductor integrated circuit further comprises a first driver circuit connected to the first bias circuit. The first driver circuit drives a first load element formed of the first material based on the first bias voltage. The semiconductor integrated circuit further comprises a second bias circuit connected to the reference voltage generating circuit and a second driver circuit connected to the second bias circuit. The second bias circuit has a second reference load element formed of a second material. The second driver circuit drives a second load element formed of the second material based on the second bias voltage.

19 Claims, 4 Drawing Sheets

SEMICONDUCTOR INTEGRATED CIRCUIT HAVING BIAS CIRCUITS EACH INCLUDING DIFFERENT REFERENCE RESISTORS

BACKGROUND OF THE INVENTION

The present invention relates to a semiconductor integrated circuit comprising an analog circuit including an operational amplifiers and a bias circuit for supplying a bias voltage to the analog circuit, particularly a semiconductor integrated circuit where the bias circuit includes a resistor.

Operational amplifiers and bias circuits used in conventional semiconductor integrated circuits are disclosed in, for example, Japanese Patent Laid-open Publication 219629/97. The bias circuit disclosed in the Japanese Patent Laid-open Publication 219629/97 is equipped with amplifying means for generating a bias voltage taking a reference voltage as an input while taking a resistor (hereinafter referred to as a reference resistor) as a load, differential amplifying means working in such a manner as to make an inputted reference voltage and the output voltage of the amplifying means the same, and current/voltage converter means for generating a bias voltage by converting current flowing through the reference resistor to a voltage. The operational amplifier is equipped with a transistor for constant current use, with the current values of the differential stage and the output stage being decided by supplying the bias voltage from the bias circuit to the gate electrode of a transistor for constant current use. Regarding the operational amplifier and the bias circuit, the current value of the operational amplifier is decided by the bias voltage only, with the bias voltage only being decided by the reference voltage and the reference resistor. The operational amplifier current is therefore constant and does not depend on the threshold values of the MOS transistors comprising the operational amplifiers and bypass circuit and fluctuations in the power supply voltage. The operation of the operational amplifier can therefore be made to be stable.

Related semiconductor integrated circuits consist of one or bias circuits of the above configuration and analog circuits. Load elements such as load resistors and driving means such as operational amplifiers of the above configuration for driving these load elements or constant current sources such as the aforementioned transistors for constant current use comprising the above operational amplifiers are formed at the analog circuit. The driving means and constant current sources comprising the analog circuitry both receive bias voltages supplied from the bias circuit.

There are also related semiconductor integrated circuits where analog circuits are divided into analog circuit blocks by gathering together constant current sources such as transistors for constant current use used in operational amplifiers capable of being simultaneously powered down, i.e. by gathering together current sources within the analog circuits from the point of view of power down control. Bias circuits are then provided for the respective analog circuit blocks with unnecessary analog circuit blocks then being selected and turned off. When powering down the analog circuit blocks in related semiconductor integrated circuits having analog circuit blocks, the output voltage of the corresponding bias circuits is switched over to, for example, zero volts and the current of the constant current sources within this analog circuit block is halted.

However, when driving means are formed on a semiconductor integrated circuit, a number of types of materials are used in making the load resistors driven by these driving means. The temperature characteristics of the load resistors and the manufacturing variations etc. are therefore different and the analog circuits therefore do not operate in a stable manner. The load resistors used here are resistors formed on the semiconductor integrated circuits or resistors (hereinafter referred to as "external resistors") externally attached to the semiconductor integrated circuit. Resistors used as reference resistors for the bias circuits are similarly resistors formed on the semiconductor integrated circuit or resistors (hereinafter referred to as "external reference resistors") externally attached to the semiconductor integrated circuit. For example, the case of using polycrystal silicon resistors (hereinafter referred to as "polycrystal silicon resistors") and diffusion resistors (impurity is diffused in a silicon substrate) as load resistors formed on the semiconductor integrated circuit and using metallic film resistors as external load resistors and then mixing these resistors on the same semiconductor integrated circuit has been considered. In this case, the bias circuit reference resistors are polycrystal silicon resistors, diffusion resistors or external resistors. In the following, load resistors and reference resistors comprising diffusion resistors are referred to as diffusion load resistors and diffusion reference resistors and load resistors and reference resistors comprising polycrystal silicon resistors are referred to as polycrystal silicon load resistors and polycrystal silicon reference resistors, respectively.

The metal film resistors can have a small temperature coefficient with a high degree of precision and it is therefore possible for external load resistors and external reference resistors to have small temperature coefficients with high degrees of precision. The structural variation between semiconductor integrated circuits for polycrystal silicon resistors is from 10 to 20 percent but the relative precision of resistance values occurring within the same semiconductor integrated circuit is good and the temperature coefficient is small. With diffusion resistors, the temperature coefficient is large and the resistance is low at low temperatures.

When the bias voltage of a bias circuit having a polycrystal silicon reference resistor is supplied to a driving means for driving a diffusion load resistor, the resistance value of the diffusion load resistor falls at the time of low temperatures but as the bias voltage does not change, the driving current is not increased and the outputted waveform therefore becomes distorted due to the driving performance of the driving means being insufficient. Distortion of the output waveform at the time of low temperatures similarly occurs when a bias voltage generated by the bias circuit employing the external reference resistor is supplied to the driving circuit for driving the diffusion load resistor. When the bias voltage of a bias circuit having a polycrystal silicon reference resistor is supplied to a driving means for driving an external load resistor, the resistor value of the polycrystal silicon reference resistor becomes larger than the designed value due to manufacturing variations. The bias voltage is therefore smaller than the design value, the driving current is small and the output waveform is distorted. In order to prevent these distorted waveforms, it is necessary to preset the driving current of the driving means for driving the diffusion load resistor and the driving means for driving the external load resistor to large values. The current consumed by the driving means as a result of this therefore becomes large. When the bias voltage of the bias circuit having a diffusion reference resistor is supplied to the driving means for driving the polycrystal silicon load resistor and the driving means for driving the external load resistor, the bias voltage becomes high at the time of low temperatures and the current consumed at the driving means becomes large.

In related semiconductor integrated circuits having analog circuit blocks gathered together from the point of view of power down control, the number of bypass circuits required is equal to the number of analog circuit blocks. The number of reference resistors on the semiconductor integrated circuit therefore increases and the semiconductor integrated circuit chip size is increased.

SUMMARY OF THE INVENTION

The object of the present invention is to provide a semiconductor integrated circuit capable of operating in a stable manner regardless of temperature fluctuation of resistor values and manufacturing variations while consuming little current. A further object of the present invention is to provide a semiconductor integrated circuit of a small chip size.

To achieve the object, the present invention provides a semiconductor integrated circuit comprises a reference voltage generating circuit which outputs a reference voltage and a first bias circuit connected to the reference voltage generating circuit. The first bias circuit has a first reference load element formed of a first material and generates a first bias voltage. The semiconductor integrated circuit further comprises a first driver circuit connected to the first bias circuit. The first driver circuit drives a first load element formed of the first material based on the first bias voltage. The semiconductor integrated circuit further comprises a second bias circuit connected to the reference voltage generating circuit and a second driver circuit connected to the second bias circuit. The second bias circuit has a second reference load element formed of a second material. The second driver circuit drives a second load element formed of the second material based on the second bias voltage.

DETAILED DESCRIPTION OF THE PREFERRED EMBODIMENTS

Figure 1:
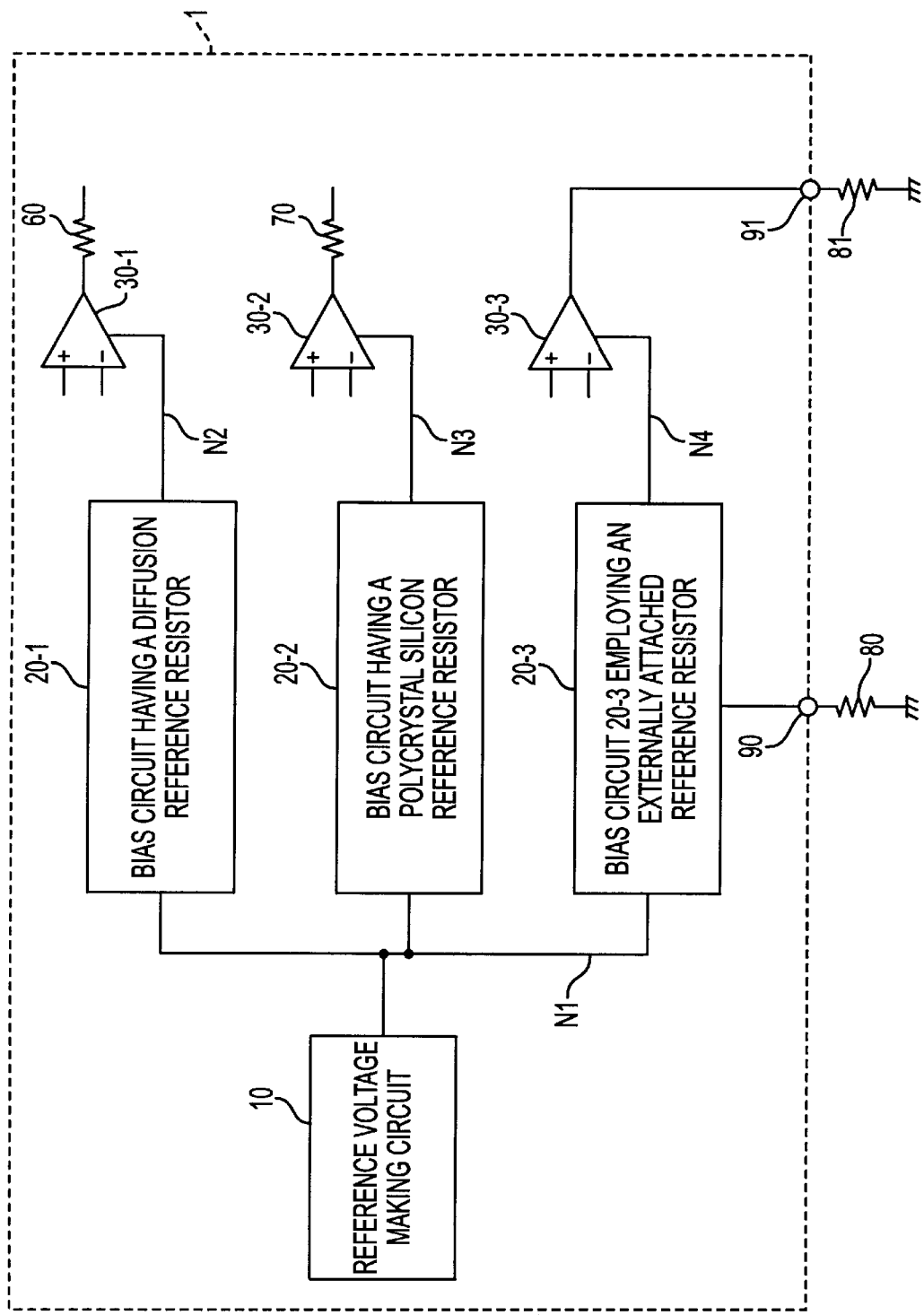
FIG. 1 is a block circuit diagram showing a semiconductor integrated circuit of a first embodiment of the present invention.

FIG. 1 is a block circuit diagram showing a semiconductor integrated circuit 1 of a first embodiment of the present invention. The semiconductor integrated circuit 1 comprises a reference voltage generating circuit 10, a first bias circuit 20-1 having a diffusion reference resistor, a second bias circuit 20-2 having a polycrystal silicon reference resistor, a third bias circuit 20-3 employing an external reference resistor 80, first to third operational amplifiers (driving means) 30-1, 30-2 and 30-3 having the same circuit configuration, a diffusion load resistor 60 constituting a load element of the first operational amplifier 30-1, a polycrystal silicon load resistor 70 constituting a load element of the second operational amplifier 30-2, a reference resistor connection terminal 90 for connecting with an external reference resistor 80 and a load connection terminal 91 for connecting with an external load resistor 81 constituting the load element of the third operational amplifier 30-3. The circuit configurations of the first and second bias circuits 20-1 and 20-2 are the same with the exception of the reference resistors being made of different materials. Further, the circuit configuration of the third bias circuit 20-3 is the same as that of the first and second bias circuits 20-1 and 20-2, with the exception of a reference resistor not being built-in.

Figure 2:
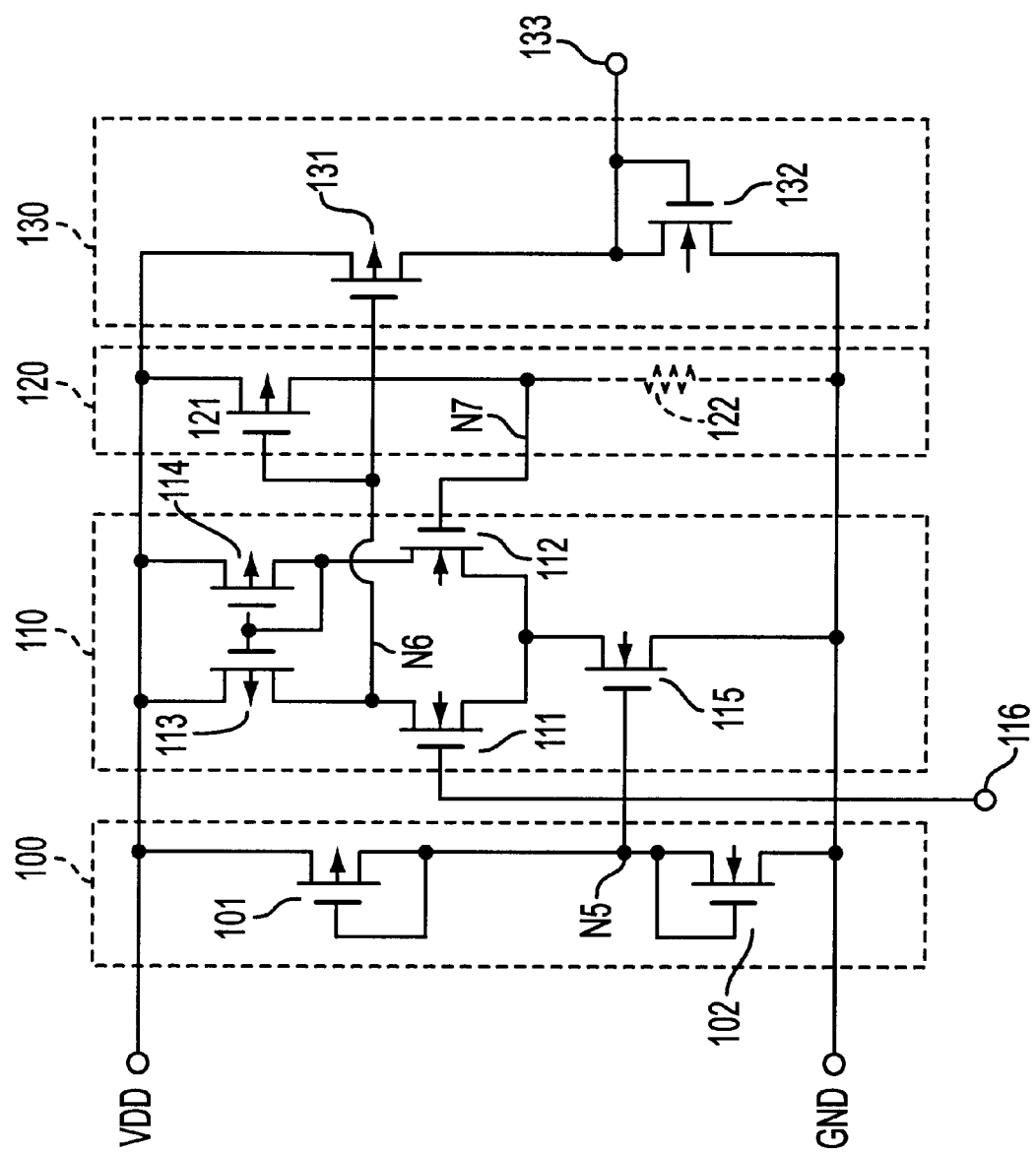
FIG. 2 is a circuit diagram showing a bias circuit of the semiconductor integrated circuit of the first embodiment of the present invention.

FIG. 2 is a circuit diagram showing the bias circuit 20-i (where i is an arbitrary integer from 1 to 3). In FIG. 2, the bias circuit 20-i includes a voltage dividing circuit 100 for generating divided voltages from a positive power supply VDD, a differential amplifier 110, a grounded source amplifier circuit 120, a current voltage converter 130, a reference voltage input terminal 116 and a bias voltage output terminal 133.

The voltage dividing circuit 100 includes a p-channel MOS transistor (hereinafter referred to as pMOS) 101 and an n-channel MOS transistor (hereinafter referred to as nMOS) 102. The voltage dividing circuit 100 generates a dividing voltage at a node N5. The source electrode of the pMOS 101 is connected to the positive power supply VDD and the source electrode of the nMOS 102 is connected to the ground GND. The gate and drain electrodes of the pMOS 101 and the nMOS 102 are connected to the node N5. The voltage dividing circuit 100 is a circuit for biasing the differential amplifier 110.

The differential amplifier 110 comprises nMOSes 111 and 112 working as input transistors, pMOSes 113 and 114 working as load transistors and an nMOS 115 for generating a constant current. The gate electrode of the nMOS 111 is connected to the reference voltage input terminal (an inverting input terminal) 116. The gate electrode of the nMOS 112 is connected to a node (a non-inverting input terminal) N7. The drain electrode of the nMOS 111 is connected to a node N6 and the drain electrode of the pMOS 113. The drain electrode of the nMOS 112 are connected to the gate and drain electrodes of the pMOS 114. The source electrodes of the nMOS 111 and the nMOS 112 are connected to the drain electrode of the nMOS 115.

The gate electrode of the pMOS 113 is connected to the gate electrode of the pMOS 114. The source electrodes of the pMOSes 113 and 114 are connected to the positive power supply VDD. The gate electrode of the nMOS 115 is connected to the node N5. The source electrode of the nMOS 115 is connected to the ground GND. The differential amplifier 110 amplifies voltage difference between the inputted reference voltage and the voltage at the node N7 and provides the amplified voltage to the node N6.

In the first and second bias circuits 20-1 and 20-2, the grounded source amplifier circuit 120 comprises a pMOS 121 and a reference resistor 122, while in the third bias circuit 20-3 the grounded source amplifier circuit 120 comprises a pMOS 121 only. The gate electrode of the pMOS 121 is connected to the node N6 regarded as an input terminal of the grounded source amplifier circuit 120. The source electrode of the pMOS 121 is connected to the positive power supply VDD. The drain electrode of the pMOS 121 is connected to the node N7 regarded as an output terminal of the grounded source amplifier circuit 120. The load resistor 122 is connected between the node N7 and the ground GND. In the third bias circuit 20-3, the node N7 is connected to the reference resistor connection terminal 90 (refer to FIG. 1) instead of the load resistor 122. The grounded source amplifier circuit 120 20 amplifies the voltage at the node N6 and provides the amplified voltage to the node N7. In the grounded source amplifier circuit 120, a reference current flows through the reference resistor 122 or the external reference resistor 80 (refer to FIG. 1).

The reference current is generated based on the inputted reference voltage by the differential amplifier 110 and the grounded source amplifier circuit 120. The differential amplifier 110 generates a voltage at the node N6 for the grounded source amplifier circuit 120 in such a manner the inputted reference voltage (voltage at node N6) and the output voltage of the grounded source amplifier circuit 120 (voltage at node N7) have the same level. That is, the level of the voltage at the node N7 is equal to that of the reference voltage. Therefore, current value of the reference current is determined by voltage value of the reference voltage and value of the reference resistor 122 or the external reference resistor 80.

The current voltage converter 130 comprises a pMOS 131 and an nMOS 132. The gate electrode of the pMOS 131 is connected to the node N6 (an input terminal of the current voltage converter 130). The source electrode of the pMOS 131 is connected to the positive power supply VDD. The drain electrode of the pMOS 131 is connected to the drain electrode and gate electrode of the nMOS 132 and the bias voltage output terminal 133. The source electrode of the nMOS 132 is connected to the ground GND. The pMOS 131 and the pMOS device 121 of the grounded source amplifier circuit 120 form a current mirror circuit. Therefore, the pMOS 121 has the same conductance of the pMOS 131. At this time, current flowing in the pMOS 131 is the same as the reference current flowing through the reference resistor 122 of the grounded source amplifier circuit 120 or the external reference resistor 80 (refer to FIG. 1). The current voltage converter 130 therefore generates a bias voltage by converting the reference current into a voltage.

In the bias circuit 20-$i$, the reference voltage is applied to the inverting input terminal of the differential amplifier 110 and the output voltage of the differential amplifier is applied to the grounded source amplifier circuit 120. The output voltage of the grounded source amplifier circuit 120 feeds back to the non-inverting input terminal of the differential amplifier 110. Therefore, a voltage equal to the reference voltage is applied across the terminals of the reference resistor 122 or the external reference resistor 80. Finally, a reference current is generated and a bias voltage determined by current value of the reference current is generated by the current voltage converter 130 where pMOS 121 of the grounded source amplifier circuit 120 and the pMOS 131 constitute a current mirror circuit.

The first bias circuit 20-1 employs a diffusion resistor formed in the semiconductor integrated circuit 1 as the reference resistor 122. The second bias circuit 20-2 employs a polycrystal silicon resistor formed in the semiconductor integrated circuit 1 as the reference resistor 122. The third bias circuit 20-3 does not have a reference resistor built-in but rather employs the external reference resistor 80 connected to the reference resistor connection terminal 90 of the semiconductor integrated circuit 1.

Figure 3:
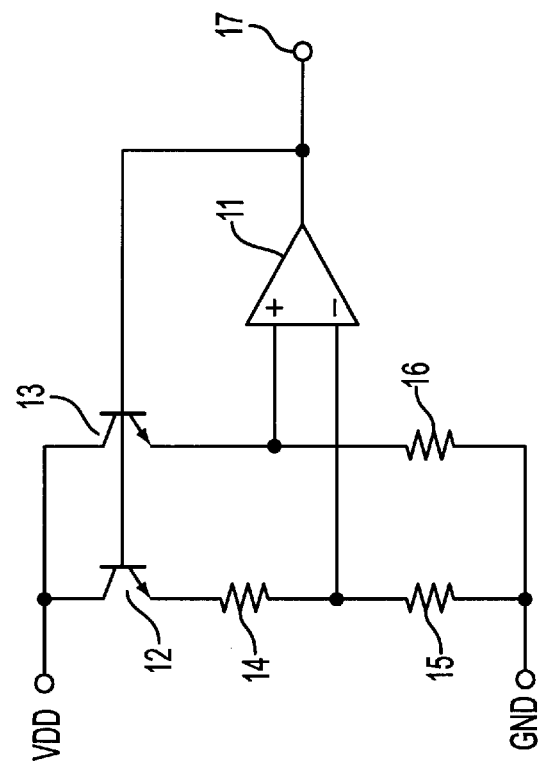
FIG. 3 is a circuit diagram showing a reference voltage generating circuit employed in the semiconductor integrated circuit of the present invention.

FIG. 3 is a circuit diagram showing the reference voltage generating circuit 10. In FIG. 3, the reference voltage generating circuit 10 comprises an operational amplifier 11, first and second npn-type bipolar transistors 12 and 13, first to third resistors 14, 15 and 16 and a reference voltage output terminal 17. An inverting input terminal of the operational amplifier 11 is connected to the emitter electrode of the second bipolar transistor 13. The output terminal of the operational amplifier 11 is connected to the base electrodes of the first and second bipolar transistors 12 and 13 and the output terminal 17. The collector electrodes of the first and second bipolar transistors 12 and 13 are connected to the positive power supply VDD. The first resistor 14 is connected between the emitter electrode of the first bipolar transistor 12 and the non-inverting input terminal of the operational amplifier 11. The second resistor 15 is connected between the non-inverting input terminal of the operational amplifier 11 and the ground GND. The third resistor 16 is connected between the inverting input terminal of the operational amplifier 11 and the ground GND. The reference voltage generating circuit 10 is a band gap reference circuit for providing reference voltage at the output terminal 17 thereof.

The output voltage of the operational amplifier 11 (the reference voltage) is the sum of the base-emitter voltage of the transistor 12 and the voltage drops across the first and second resistors 14 and 15. As the potentials at the inverting input terminal and the non-inverting input terminal of the operational amplifier 11 are the same, the voltage difference between the base-emitter voltage of the first bipolar transistor 12 and the base-emitter voltage of the second bipolar transistor 13 is the voltage applied between the terminals of the first resistor 14. Current flowing from the first bipolar transistor 12 through the first and second resistors 14 and 15 is determined by the value of the first resistor 14 and the voltage difference described above. The voltage drop occurring at the first and second resistors 14 and 15 is a function of the temperature, dimension of area of the emitters of the first and second transistors 12 and 13 and the value of the first to third resistors 14, 15 and 16. The base-emitter voltage of the first bipolar transistor 12 is a function of a band gap voltage of silicon constituting the semiconductor substrate and temperature. A temperature coefficient and the emitter area included in the output voltage of the operational amplifier 11 can be compensated for by selecting the resistance values of the resistors 14, 15 and 16. The output voltage of the operational amplifier 11 is approximately equal to the band gap voltage of silicon (about 1.1 volts) and is a stable voltage that is not influenced by temperature fluctuations, manufacturing variations and power supply voltage fluctuations.

Figure 4:
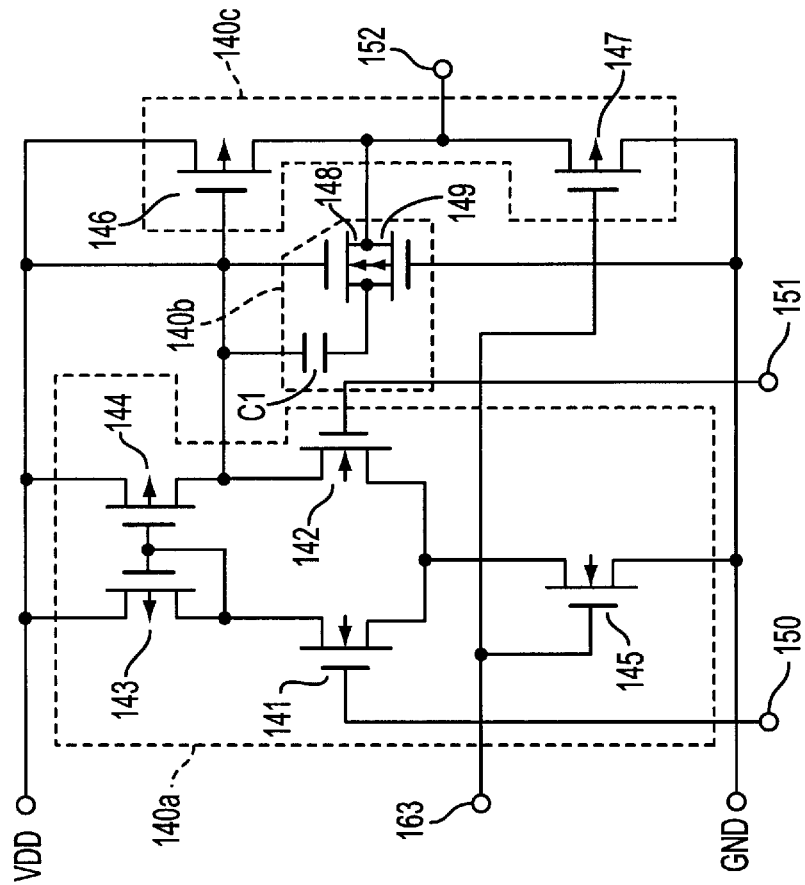
FIG. 4 is a circuit diagram showing an operational amplifier employed in the semiconductor integrated circuit of the present invention.

FIG. 4 is a circuit diagram showing an operational amplifier 30-$i$. In FIG. 4, the operational amplifier 30-$i$ comprises a differential circuit 140$a$, an output circuit 140$b$, a phase compensation circuit 140$c$, differential input terminals 150 and 151, an output terminal 152 and a bias input terminal 153 to which the bias voltage is applied. The differential circuit 140$a$ comprises nMOSes 141 and 142 as input transistors, pMOSes 143 and 144 as load transistors and an nMOS 145 for generating a constant current. The output circuit 140$b$ comprises a pMOS 146 as an output transistor and an nMOS 147 as a load transistor for generating a constant current. The phase compensation circuit 140$c$ comprises an nMOS 148, a pMOS 149 and a capacitor C1.

In the differential circuit 140$a$, the gate electrode of the nMOS 141 is connected to the differential input terminal 150. The drain electrode of the nMOS 141 is connected to the drain electrode and the gate electrode of the pMOS 143 and the gate electrode of the pMOS 144. The gate electrode of the nMOS 142 is connected to the differential input terminal 151. The drain electrode of the nMOS 142 is connected to the drain electrode of the pMOS device 144. The source electrodes of the nMOS 141 and the nMOS 142 are connected to the drain electrode of the nMOS 145. The source electrodes of the pMOS 143 and 144 are connected to the positive power supply VDD. The gate electrode of the nMOS 145 is connected to the bias input terminal 153. The source electrode of the nMOS 145 is connected to the ground GND. In the output circuit 140*b*, the gate electrode of the pMOS 146 is connected to the drain electrode of the pMOS 144 of the differential circuit 140*a*. The source electrode of the pMOS 146 is connected to the positive power supply VDD. The drain electrode of the pMOS 146 is connected to the drain electrode of the nMOS 147 and the output terminal 152. The gate electrode of the nMOS 147 is connected to the bias input terminal 153. The source electrode of the nMOS 147 is connected to the ground GND.

The operational amplifier 30-*i* is an A class CMOS amplifier. The operational amplifier 30-*l* drives the load element connected to the output terminal 152 with a driving current flowing from or being drawn out to the output terminal. Where the bias voltage is high, the current flowing to the nMOS 147 is large and a large driving current can be drawn out from the output terminal 152. That is, the load driving performance of this A class CMOS amplifier is improved for a high bias voltage. Each of the nMOSes 145 and 147 constitutes a current mirror circuit with the nMOS 132 of the current voltage converter 130 of the bias circuit 20-*i*. The nMOSes 145 and 147 have the same conductance as the nMOS 132 or a conductance proportional to that of the nMOS 132. Therefore, the constant current flowing through the nMOSes 145 and 147 is a consumed current within the operational amplifier 30-*i*.

As shown in FIG. 1, the output terminal (the output terminal 17 of FIG. 3) of the reference voltage generating circuit 1 0 is connected to the input terminal (input terminal 116 of FIG. 2) of the firs to third bias circuits 20-1, 20-2 and 20-3 via the node N1. The output terminal (the output terminal 133 of FIG. 2) of the first bias circuit 20-1 is connected to the bias input terminal (the bias input terminal 153 of FIG. 4) of the first operational amplifier 30-1 via the node N2. A diffusion load resistor 60 is connected to the output terminal (output terminal 152 of FIG. 4) of the first operational amplifier 30-1 as a load element. The output terminal of the second bias circuit 20-2 is connected to the bias input terminal of the second operational amplifier 30-2 via the node N3. The polycrystal silicon load resistor 70 is connected to the output terminal of the second operational amplifier 30-2 as a load element. The output terminal of the third bias circuit 20-3 is connected to the bias input terminal of the third operational amplifier 30-3 via the node N4. The output terminal of the third operational amplifier 30-3 is connected to the load connection terminal 91 and the external load resistor 81 is connected to the load connection terminal 91.

The operation of the semiconductor integrated circuit 1 shown in FIG. 1 is described. The reference voltage generating circuit 10 provides a stable reference voltage that is not influenced by temperature fluctuations, manufacturing differences or power supply voltage fluctuations. The reference voltage is supplied to the reference voltage input terminal 116 of the first to third bias circuits 20-1, 20-2 and 20-3.

In the bias circuit 20-*l*, the reference voltage from the reference voltage generating circuit 10 is supplied to the inverting input terminal (gate electrode of nMOS 111) of the differential amplifier 110 via the reference voltage input terminal 116. The differential amplifier 110 amplifies the potential difference of the inverting input terminal and the non-inverting input terminal (the gate electrode of the nMOS 112 connected to the node N7) and provides the amplified potential difference to the node N6 (drain electrode of the nMOS 111). The grounded source amplifier circuit 120 inverts and amplifies the amount of change of the potential at the node N6 and provides inverted and amplified amount to the node N7. The voltage at the node N7 then becomes equal to the reference voltage applied at the reference voltage input terminal 116 by the operation of the differential amplifier 110 and the grounded source amplifier circuit 120. That is, where there is a difference between the applied reference voltage and the voltage at the node N7, the differential amplifier 110 amplifies the voltage difference between them and applies the amplified voltage difference to the grounded source amplifier circuit 120. The grounded source amplifier circuit 120 then inverts and amplifies the voltage difference applied from the differential amplifier 110 and outputs the inverted and amplified voltage difference to the node N7 (feeds the inverted and amplified voltage difference back to the non-inverting input terminal of the differential amplifier 110). The voltage at the node N7 therefore finally becomes equal to the reference voltage applied to the reference voltage input terminal 116.

In the grounded source amplifier circuit 120, the reference current is a current flowing from pMOS 121 through the reference resistor 122 (in the third bias circuit 20-3 the external reference resistor 80). The current value of the reference current is calculated that the voltage at the node N7 (equal to the reference voltage) is divided by the resistance value of the reference resistor 122 (or the external reference resistor 80). Therefore, the current value of the reference current is determined only by the reference voltage and the resistance value of the reference resistor (or the external reference resistor) and does not depend on the power supply voltage and fluctuations (manufacturing variations) in the characteristics of other active elements.

The current voltage converter 130 converts the reference current flowing in the grounded source amplifier circuit 120 into a bias voltage. The current voltage converter 130 is supplied to the voltage of the node N6 as input, and provides the bias voltage to the output terminal 133 for supplying to the operational amplifier 30-*i*. Since the pMOS 131 and the pMOS 121 have the same conductance, the current flowing through the pMOS 131 and the nMOS 132 is the same value of the reference current flowing through the pMOS 121 and the reference resistor 122 (or the external reference resistor 80). Therefore, the current flowing through the pMOS 131 and the nMOS 132 is determined only by the reference voltage and the resistance value of the reference resistor (externally attached reference resistor) and does not depend on the power supply voltage and fluctuations (manufacturing variations) in the characteristics of other active elements.

On the other hand, in the operational amplifier 30-*i*, the bias voltage appeared at the output terminal 133 of the bias circuit 20-*i* is supplied to the gate electrodes of the nMOSes 145 and 147. The nMOSes 145 and 147 have the same conductance or a conductance proportional to that of the nMOS 132 of the current voltage converter 130. Therefore, the nMOSes 145 and 147 constitute a current mirror circuit together with the nMOS 132. The current flowing through the nMOSes 145 and 147 has a value equal or proportional to the reference current. The current consumed by the differential and output circuits of the operational amplifier 30-*i* has a stable value that does not depend on the power supply voltage. The value of the current consumed by the operational amplifier 30-*i* is then determined by the value of the reference voltage and the resistance value of the reference resistor 122 (external reference resistor 80). Therefore, it does not depend on power supply voltage fluctuations and fluctuations (manufacturing variations) in the characteristics of other active elements.

The diffusion load resistor 60 has a low resistance when the temperature is low. Since the reference resistor 122 of the first bias circuit 20-1 is a diffusion reference resistor, the resistance value of this diffusion reference resistor also becomes small in the same way as the diffusion load resistor 60, the reference current increases, and the current flowing in the pMOS 132 also increases in the same way as the reference current. As a result, the bias voltage rises and the current flowing in the nMOSes 145 and 147 of the first operational amplifier 30-1 also increase in the same way as the current flowing in the pMOS 132. The first operational amplifier 30-1 can therefore drive a load resistor of a smaller resistance value. Namely, when the resistance value of the diffusion load resistor 60 is low at the time of low temperatures, the driving performance of the first operational amplifier 30-1 driving the diffusion load resistor 60 becomes large and the waveform outputted by the first operational amplifier 30-1 does not become distorted.

In the operational amplifier (driving circuit) of the related semiconductor integrated circuit, in considering variation of the power supply voltage, temperature fluctuations, fluctuations in the characteristics of the operational amplifier due to fluctuations in the resistance value of the reference resistors by the manufacturing variation and variation of the resistance value of the load resistor, it is necessary to make a value of current, flowing the constant current source transistor of the output circuit of the operational amplifier, dramatically larger than the current value required to flow at the load resistor. However, at the first operational amplifier 30-1 of the semiconductor integrated circuit 1 of the present invention, the value of the current flowing through the nMOS 147 can be taken to be a current value just slightly larger than the value of the current required to flow through the diffusion load resistor 60. The current consumed at the first operational amplifier 30-1 can therefore be made substantially smaller.

When the manufacturing material of resistors is the same, the absolute values of the resistance values of resistors formed in the same semiconductor integrated circuit vary to a certain extent but the relative values are finished in a precise manner. As a result, even if the resistance value of the polycrystal silicon load resistor 70 becomes small due to manufacturing variations, the polycrystal silicon reference resistor of the second bias circuit 20-2 also becomes smaller in a proportional manner and the value of the reference current flowing through the polycrystal silicon reference resistor becomes large, so that the bias voltage generated by the second bias circuit 20-2 becomes large. As the current flowing through the nMOSes 145 and 147 of the operational amplifier 30-2 for driving the polycrystal silicon load resistor 70 therefore increases and the driving performance of the operational amplifier 30-2 becomes large, the output waveform of the second operational amplifier 30-2 is not distorted. Further, in the operational amplifier 30-2, as with the first operational amplifier 30-1, the value of the current flowing through the nMOS 147 of the output circuit can be taken to be a current value just slightly larger than the current value required to flow through the polycrystal silicon load resistor 70. Therefore, the current consumed by the second operational amplifier 30-2 can be made dramatically smaller.

The resistance values of the external reference resistor 80 and the external load resistor 81 are highly precise and fluctuate little with temperature. As the third bias circuit 20-3 employs the external reference resistor 80 and the third operational amplifier 30-3 drives the external load resistor 81, the bias circuit 20-3 generates a stable bias voltage regardless of temperature fluctuations of the resistors in the semiconductor integrated circuit and manufacturing variations. The output waveform of the third operational amplifier 30-3 is therefore not distorted because the bias voltage and the resistance value of the external load resistor 81 is stable. Further, in the third operational amplifier 30-3, as with the first and second operational amplifiers 30-1 and 30-2, the value of the current flowing through the nMOS 147 in the output circuit can be taken to be a current value just slightly larger than the current value required to flow through the external load resistor 81. Therefore, the current consumed by the operational amplifier 30-3 can be made dramatically smaller.

According to the first embodiment, the first bias circuit 20-1 having a diffusion reference resistor, the second bias circuit 20-2 having a polycrystal silicon substrate resistor and the third bias circuit 20-3 employing an external reference resistor are provided for the first operational amplifier 30-1 for driving the diffusion load resistor 60, the second operational amplifier 30-2 for driving the polycrystal silicon load resistor 70 and the third operational amplifier 30-3 for driving the external load resistor 81, respectively. The bias voltage generated by the first bias circuit 20-1 s supplied to the first operational amplifier 30-1 and the diffusion load resistor 60 is driven by the first operational amplifier 30-1. The bias voltage generated by the second bias circuit 20-2 is supplied to the second operational amplifier 30-2 and the polycrystal silicon load resistor 70 is driven by the second operational amplifier 30-2. The bias voltage generated by the third bias circuit 20-3 is supplied to the third operational amplifier 30-3 and the external load resistor 81 is then driven by the third operational amplifier 30-3. A stable semiconductor integrated circuit where there is no distortion in the output waveforms of any of the operational amplifiers regardless of temperature fluctuations and manufacturing variations can therefore be realized.

The material from which the load resistor driven by the operational amplifier is made and the material from which the reference resistor for the bias circuit supplying the bias voltage to the operational amplifier is made are the same and the bias voltage supplied to the operational amplifier driving the external resistor is generated by the bias circuit employing the external reference resistor. In this way, when the resistance value of the load resistors of the operational amplifiers drops due to temperature fluctuations or manufacturing variations, the resistance value of the reference resistor of the bias circuit also drops and the load driving performance of the operational amplifiers therefore increases. A stable semiconductor integrated circuit where there is no fear of distortion of the output waveform of the operational amplifiers can therefore be realized.

It is therefore no longer necessary to make the value of the current flowing through the transistor for constant current use of the output circuit of the operational amplifier a dramatically larger current value than the current value required to flow through the load resistor as was the case in related semiconductor integrated circuits and the current value can be made just slightly larger than the value of the current required to flow through the load resistor. The amount of current consumed by the semiconductor integrated circuit can therefore be dramatically reduced.

Since the sheet resistance of diffusion resistors formed in semiconductor integrated circuits is generally high, resistors having high resistance values can therefore be realized on the same surface area. However, these resistors are characterized by slightly higher harmonic distortion. Polycrystal silicon resistors, on the other hand, generate almost no higher harmonic distortion. The first embodiment utilizes the characteristics of resistors constructed from different materials so as to mix diffusion resistors and polycrystal silicon resistors in the same semiconductor integrated circuit, with the invention being effective in the case where diffusion resistors and polycrystal silicon resistors are divided up and used as load resistors for operational amplifiers. Here, a first bias circuit having a reference resistor made of a first material is provided for an operational amplifier driving the load resistor made of the first material and a second bias circuit having a reference resistor made of a second material is provided for an operational amplifier driving a load resistor made of a second material. Further, in the first embodiment, a third bias circuit employing an external reference resistor is provided for the operational amplifier driving the external resistor.

The semiconductor integrated circuit 1 of the first embodiment can also be a mixture of the first analog circuit block including load resistors made of a first material and operational amplifiers driving the first material resistors and a second analog circuit block including load resistors made of the second material and operational amplifiers driving the second material load resistors. In this case, the first bias circuit is provided for the first analog circuit block and the second bias circuit is provided for the second analog circuit block.

The semiconductor integrated circuit 1 of the first embodiment can also be a combination of the first and second analog circuit blocks and the third analog circuit block including load connection terminals for connecting external load resistors. In this case, the third bias circuit can be provided for the third analog circuit block. The first analog circuit block and the third analog circuit block can be combined in the same semiconductor integrated circuit. In this case, the first and third bias circuits can also be provided.

In the above first embodiment, the first and second load elements formed on the semiconductor integrated circuit are diffusion resistors and polycrystal silicon resistors and a description is given for the case where the external load element is an external load resistor. However, the first and second load resistors can both be capacitors, as can the external load element. Capacitors are highly precise and temperature fluctuations are small. Therefore when capacitors are taken as the load elements (external load elements), the third bias circuit 20-3 can be used as the bias circuit for the operational amplifier. If manufacturing variations in the polycrystal silicon substrate resistor can be permitted, the second bias circuit 20-2 can be employed. Further, if manufacturing variations in the polycrystal silicon substrate resistors are permitted, one of either the second bias circuit 20-2 and the third bias circuit 20-3 can be eliminated and the bias voltage generated by the bias circuit of the remaining circuit can be supplied to the operational amplifier 30-2 for driving the polycrystal silicon load resistor 70 and the third operational amplifier 30-3 for driving the external load resistor 81.

Namely, the semiconductor integrated circuit 1 of the first embodiment is a combination of two types or more of load elements of different electrical characteristics such as temperature characteristics in the semiconductor integrated circuit or a combination of load elements formed in the semiconductor integrated circuit and load connecting terminals for connecting external load elements of different electrical characteristics such as temperature characteristics than those of these load elements. In this case, bias circuits are provided each load element of different electrical characteristics or external load element. Resistors having electrical characteristics analogous to the corresponding load elements can then be employed as reference resistors for the respective bias circuits.

In a semiconductor integrated circuit which combines first to third analog circuit blocks, when the electrical characteristics of the second load element included in the second analog circuit block and the electrical characteristics of the external load element connected to the third analog circuit block are analogous, a single bias circuit employing a reference resistor (externally attached reference resistor) of the same electrical characteristics as the second load element and the external load element can be provided for the second analog circuit block and the third analog circuit block.

Figure 5:
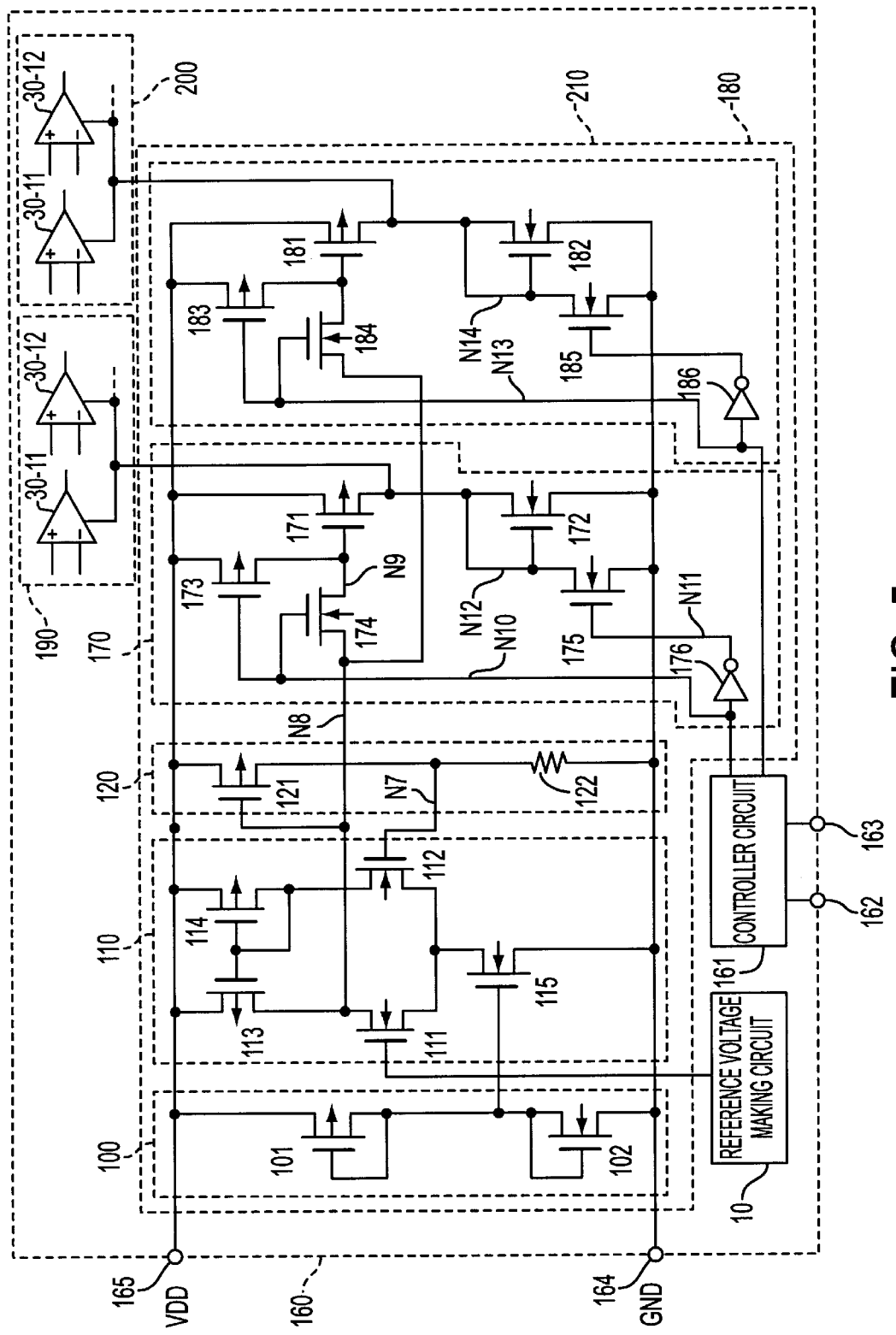
FIG. 5 is a circuit diagram showing a second embodiment of the present invention.

FIG. 5 is a circuit diagram showing a semiconductor integrated circuit 160 of a second embodiment of the present invention. The semiconductor integrated circuit 160 of FIG. 5 comprises the reference voltage generating circuit 10, a control circuit 161, a bias circuit 210, a first analog circuit block 190, a second analog circuit block 200, external connection terminals 162 and 163, a first power supply connecting terminal 164 for connecting to ground GND and a second power supply connecting terminal 165 for connecting to the positive supply VDD. The first analog circuit block 190 and the second analog circuit block 200 can be taken together as a functional block from the point of view of power down control. In FIG. 5, items that correspond to items in FIG. 1 are given the same numerals.

In FIG. 5, the control circuit 161 comprises a first input terminal connected to the external connection terminal 162 of the semiconductor integrated circuit 160, a second input terminal connected to the external connection terminal 163 of the semiconductor integrated circuit 160, a first output terminal connected to the node N10 and a second output terminal connected to the node N13. A first control signal indicating to operate or power down the first analog circuit block 190 is outputted from the first output terminal of the control circuit 161 and a second control signal indicating to operate or power down the second analog circuit block 200 is outputted from the second output terminal of the control circuit 161 in accordance with external control signals inputted from outside from the first and second input terminals of the control circuit 161.

The bias circuit 210 comprises the voltage dividing circuit 100, differential amplifier 110, grounded source amplifier circuit 120, a first current/voltage converter 170 and a second current/voltage converter 180. That is, the bias circuit 210 is provided with the current/voltage converters 170 and 180, rather than the current voltage converter 130 in the bias circuit 20-$i$ of FIG. 2. The bias circuit 210 has a reference resistor 122 built-in, but an external reference resistor of the kind of the third bias circuit 20-3 of FIG. 1 can also be used. Therefore, in FIG. 5 also, the reference voltage from the reference voltage generating circuit 10 is inputted to the inverting input terminal (the gate electrode of the nMOS 111) of the differential amplifier 110.

The first current/voltage converter 170 comprises the pMOSes 171 and 173, the nMOSes 172, 174 and 175 and an inverter 176. The gate electrode of the nMOS 173 is connected to a node 10 connected to the first output terminal of the control circuit 161. The drain electrode of the nMOS 173 is connected to the node N9. The source electrode of the nMOS 173 is connected to the positive supply VDD. The gate electrode of the nMOS 174 is connected to the node N10. The drain electrode of the nMOS 174 is connected to the node N9. The source electrode of the nMOS 174 is connected to node N6 (the node connected to the gate electrode of the pMOS 121 of the grounded source amplifier circuit 120). The gate electrode of the pMOS 171 is connected to node N9. The source electrode of the pMOS 171 is connected to the positive supply VDD. The drain electrode of the pMOS 171 is connected to the node N12. The conductance of the pMOS 171 has the same as the pMOS 121 of the grounded source amplifier circuit 120.

The input terminal of the inverter 176 is connected to node N10. The output terminal of the inverter 176 is connected to node N11. The gate electrode of the nMOS 175 is connected to node N11. The source electrode of the nMOS 175 is connected to ground GND. The drain electrode of the nMOS 175 is connected to node N12. The gate electrode and the drain electrode of the nMOS 172 is connected to the node N12. The source electrode of the nMOS 172 is connected to ground GND. The input terminal of the first current/voltage converter 170 is connected to the node N6. The control input terminal of the first current/voltage converter 170 is connected to the node N10. The output terminal of the first current/voltage converter 170 is connected to the node N12. The first current/voltage converter 170 causes the first analog circuit block 190 to operate or power down in accordance with the first control signal inputted to the control input terminal of the first current/voltage converter 170 from the control circuit 161.

The second current/voltage converter 180 comprises pMOSes 181 and 183, nMOSes 182,184 and 185 and an inverter 186. The second current/voltage converter 180 has the same circuit structure as the first current/voltage converter 170. In the second current/voltage converter 180, the pMOSes 181 and 183 correspond to the pMOSes 171 and 173 of the first current/voltage converter 170, nMOSes 182, 184 and 185 correspond to the nMOSes 172,174 and 175 of the first current/voltage converter 170 and the inverter 186 corresponds to the inverter 176 of the first current/voltage converter 170. The conductance of the pMOS 181 has the same as that of the pMOS 121 of the grounded source amplifier circuit 120. Nodes N13 and N14 of the second current/voltage converter 180 correspond to the nodes N10 and N12 of the first current/voltage converter 170, respectively. The input terminal of the second current/voltage converter 180 is connected to the node N6. The control input terminal of the second current/voltage converter 180 is connected to the node N13 connecting with the second output terminal of the control circuit 161. The output terminal of the second current/voltage converter 180 is connected to the node N14. The second current/voltage converter 180 operates or powers down the second analog circuit block 200 in accordance with the second control signal inputted to the control input terminal of the second current/voltage converter 180 from the control circuit 161.

The bias circuit 210 generates a single reference current based on the inputted reference voltage and generates bias voltages based on the reference current. That is, the bias circuit 210 comprises a reference current generating circuit consisting of the differential amplifier 110 and the grounded source amplifier circuit 120 including a reference resistor 122, and current/voltage generating circuits. The bias voltages are generated from the reference resistor 122 formed in the grounded source amplifier circuit 120.

The first analog circuit block 190 comprises operational amplifiers 30-11 and 301-12. The second analog circuit block 200 comprises operational amplifiers 30-13 and 3-14. The circuit configuration of the operational amplifier 30-j (where j is an arbitrary integer from 11 to 14) is the same as that of the operational amplifiers of the first embodiment shown in FIG. 4. The bias input terminals (bias input terminal 153 of FIG. 4) of the operational amplifiers 30-11 and 30-12 of the first analog circuit block 190 are connected to the node N12 connected to the output terminal of the first current/voltage converter 170. The bias input terminals of the operational amplifiers 30-13 and 30-14 of the second analog circuit block 200 are connected to node N14 connected to the output terminal of the second current/voltage converter 180. The first analog circuit block 190 operates normally when a bias voltage is outputted at the node N12 by the first current/voltage converter circuit in accordance with the potential of the node N6. The first analog circuit block 190 powers down when the node N12 is at ground potential. Similarly, the second analog circuit block 200 operates normally when a bias voltage is outputted at the node N14 by the second current/voltage converter circuit in accordance with the potential of the node N6. The second analog circuit block 200 powers down when the node N14 is at ground potential.

The first and second analog circuit blocks 190 and 200 are not limited to the circuits having operational amplifiers, but have a current source such as a transistor for constant current use taking the bias voltage as input. For example, the first and second analog circuit blocks 190 and 200 can be comparators having transistors for constant current use or PLL circuits.

The operation of the semiconductor integrated circuit 160 of FIG. 5 is described. The reference voltage generating circuit 10 supplies a reference voltage to the inverting input terminal (gate electrode of the nMOS 111) of the differential amplifier 110 of the bias circuit 210. It the bias circuit 210, the voltage of the node N7 becomes equal to the reference voltage due to the working of the differential amplifier 110 and the grounded source amplifier circuit 120.

The control circuit 161 comprises, for example, logic gates and buffers. The control circuit 161 may set the potential level of the first control signal and the potential level of the second control signal to a high level (VDD potential) or a low level (GND potential) in accordance with two external control signals inputted via the external connection terminals 162 and 163. The control circuit 161 outputs the first control signal to the node N10 and the second control signal to the node N13. When the first control signal of the control circuit 161 has the high level, the first analog circuit block 190 is made to be operated. When the first control signal of the control circuit 161 has low level, the first analog circuit block 190 is made to be powered down. Similarly, when the second control signal of the control circuit 161 has the high level, the second analog circuit block 200 is made to be operated. When the second control signal of the control circuit 161 has the low level, the second analog circuit block 200 is made to be powered down. That is, when the control circuit 161 sets the first control signal to the high level, the first current/voltage converter 170 makes the first analog circuit block 190 operate. When the control circuit 161 sets the first control signal to the low level, the first current/voltage converter 170 makes the first analog circuit block 190 power down.

Similarly, the second current/voltage converter 180 makes the second analog circuit block 200 operate when the control circuit 161 sets the second control signal to the high level. The second current/voltage converter 180 makes the second analog circuit block 200 power down when the control circuit 161 sets the second control signal to the low level.

When the first control signal has the high level, there is the high level at the node N10 in the first current/voltage converter 170. Then, the pMOS 173 tunes off and the nMOS 174 tunes on. As the pMOS 173 is in the off state and the nMOS 174 is in the on state, the voltage of the node N6 is applied to the gate electrode of the pMOS 171 and the pMOS 171 operates in the saturation region. The first control signal is then inverted by the inverter 176 and the node N11 turns to the low level so that the nMOS 175 tunes off. Therefore, when the first control signal has the high level, the first current/voltage converter 170 have the same circuit configuration as the current voltage converter 130 of FIG. 2 (the pMOS 171 corresponds to the pMOS 131 of FIG. 2 and the nMOS 172 corresponds to the nMOS 132 of FIG. 2), a current has the same current value as the reference current generated by the grounded source amplifier circuit 120 flows through the nMOS 171 and the nMOS 172. The bias voltage determined by the flowing current through the nMOS 171 and the nMOS 172 and the impedance of the nMOS 172 is appeared at the node N12. The bias voltage is then supplied to the gate electrodes of the constant current source nMOS 145 and 147 (shown in FIG. 4) of the operational amplifiers 30-11 and 30-12 of the first analog circuit block 190. Therefore, the first analog circuit block 190 operates normally.

Similarly, when the second control signal has the high level, in the second current/voltage converter 180, the pMOS 183 turns off and the nMOS 184 tuns on. The voltage at the node N6 is applied to the gate electrode of the pMOS 181 and the pMOS 181 operates in the saturation region. The nMOS 185 turns off by the inverter 186. Therefore when the second control signal has the high level, the second current/voltage converter 180 has the same circuit configuration as the current voltage converter 130 of FIG. 2. A current having the same current value as the reference current generated by the grounded source amplifier circuit 120 is generated through the nMOS 181 and the nMOS 182. The bias voltage determined by the impedance of the nMOS device 182 and the current flowing through nMOS 181 and the nMOS 182 is appeared at node N14. The bias voltage is supplied to the bias input terminal of the operational amplifiers 30-13 and 30-14 of the second analog circuit block 200. Therefore, the second analog circuit block 200 operates normally.

When the first control signal has the low level, there appears low level at node N10 in the first current/voltage converter 170. Then, the pMOS 173 turns on and the nMOS 174 turns off. The gate electrode of the PMOS 171 turns to the high level (VDD potential) and the pMOS 171 turns off. Further, there appears high level at the node N11 by the inverter 176 and the nMOS device 175 therefore turns on. When the first control signal has the low level, there appears low level (GND potential) at the node N12. As there is the low level at the node N12, the low level is appeared at the gate electrodes of the nMOSes 145 and 147 (refer to FIG. 4) of the operational amplifiers 30-11 and 30-12 of the first analog circuit block 190. Therefore, the nMOSes 145 and 147 for constant current use both turn off. The current consumed in the operational amplifiers 30-11 and 30-12 is no longer existed due to the nMOSes 145 and 147 being off. Therefore, the first analog circuit block 190 powers down.

When the second control signal has the low level, in the second current/voltage converter 180, the pMOS 183 turns on and the nMOS 184 turns off. The high level (potential VDD) is appeared at the gate electrode of the pMOS device 181, the pMOS 181 turns off, and the nMOS 185 is turned on by the inverter 186. Therefore, when the second control signal has the low level, there appears low level (GND potential) at node N14 and the constant current source nMOS device's 145 and 147 (refer to FIG. 4) of the operational amplifiers 30-13 and 30-14 of the first analog circuit block 190 turn off. The current consumed in the operational amplifiers 30-13 and 30-14 is therefore no longer existed and the second analog circuit block 200 is powered down.

Where there are no operational amplifiers within the first analog circuit block 190 nor the second analog circuit block 200 and a constant current source such as a transistor for constant current use taking the bias voltage as input is present, the bias voltage should be turned to the low level and the current does not flow through the constant current source and the whole of the analog circuit block can be powered down.

According to the second embodiment, there is provided the reference current generating circuit including the reference resistor 122 and the bias circuit including a current/voltage converters corresponding to respective analog circuit blocks and being input to control signals corresponding to the reference voltage and respective analog circuit blocks in the semiconductor integrated circuit 160 having the analog circuit blocks. The single reference current is generated by the reference current generating circuit based on the reference voltage. The individual bias voltages are generated based on the single reference current in each current/voltage converters. The bias voltages are outputted at corresponding analog circuit blocks based on corresponding control signals or the outputting is halted. Therefore, the number of reference resistors, which were provided in the analog circuit blocks can be reduced. As resistors in the semiconductor integrated circuit require a large pattern surface area, the amount of surface area occupied by the bias circuit in the semiconductor integrated circuit can be made small and a semiconductor integrated circuit of a small chip size can therefore be realized. This reduction of chip size causes that reducing the cost of the semiconductor integrated circuit can be made possible.

The number of the voltage dividing circuit 100, differential amplifier 110 and the grounded source amplifier circuit 120 can also be reduced. The current consumption of these circuits can also be reduced and the current consumption of the semiconductor integrated circuit can therefore be made small.

In FIG. 5, when the first analog circuit block 190 and the second analog circuit block 200 are powered down, a circuit that powers down the voltage dividing circuit 100, the differential amplifier 110 and the grounded source amplifier circuit 120 is not provided but this circuit can easily be added.

Further, the control circuit 161 is not essential and first and second control signals can be supplied to the first and second current/voltage converter 170, 180 from outside.

When power down control is not required and, for example, analog circuit blocks requiring bias voltages of different values are formed in a semiconductor integrated circuit, current voltage converters 130 as shown in FIG. 2, rather than the first current/voltage converter 170 and the second current/voltage converter 180, can be provided as the bias circuit 210 at each of the analog circuit blocks. In this way, the chip size of the semiconductor integrated circuit can be made small where bias circuits are provided for each respective circuit block, costs can be reduced and the current consumed can be made small.

In the first and second embodiments, a description is given of semiconductor integrated circuits configured principally of MOS transistors but transistors constituting the semiconductor integrated circuit are by no means limited to MOS transistors.

According to the semiconductor integrated circuit device typical of the present invention described above, a stable semiconductor integrated circuit where the output waveform of a driving circuit is not distorted regardless of temperature fluctuations and where power consumption is small can be realized.

What is claimed is:

1. A semiconductor circuit comprising:
    a reference voltage generating circuit which outputs a reference voltage;
    a first bias circuit connected to the reference voltage generating circuit, the first bias circuit having a first reference load element formed of a first material and generating a first bias voltage;
    a first driver circuit connected to the first bias circuit, the first driver circuit driving a first load element formed of the first material based on the first bias voltage;
    a second bias circuit connected to the reference voltage generating circuit, the second bias circuit having a second reference load element formed of a second material; and
    a second driver circuit connected to the second bias circuit, the second driver circuit driving a second load element formed of the second material based on the second bias voltage.

2. A semiconductor circuit according to claim 1, wherein said first bias circuit includes:
    a reference current generating circuit connected between a first power supply and a second power supply, and to said reference voltage generating circuit, the reference current generating circuit including the first reference load element and generating a reference current based on a resistance value of the first reference load element; and
    a current voltage converter connected between the first power supply and the second power supply, and to the reference current generating circuit, the current voltage converter converting the reference current to the first bias voltage.

3. A semiconductor circuit according to claim 2, wherein the reference current generating circuit includes:
    a voltage dividing circuit connected between the first power supply and the second power supply, the voltage dividing circuit outputting the divided voltage;
    a differential amplifier connected between the first power supply and the second power supply, and to the voltage dividing circuit and said reference voltage generating circuit, the differential amplifier outputs amplified voltage based on the reference voltage and the divided voltage; and
    a grounded source amplifier circuit connected between the first power supply and the second power supply, and to the differential amplifier, the grounded source amplifier circuit including the first reference load element and generating a reference current based on a first resistance value of the first reference load element.

4. A semiconductor circuit according to claim 1, wherein said first driver circuit is an operational amplifier having a non-inverting input terminal, an inverting input terminal, an bias input terminal connected to the first bias circuit and an output terminal connected to the first load element.

5. A semiconductor circuit according to claim 1, wherein the first reference load element is a diffusion resistor and the first material is a silicon substrate and impurity.

6. A semiconductor circuit according to claim 2, wherein said first driver circuit and the current voltage converter have constant current transistors, respectively, and wherein the constant current transistors constitute a current mirror circuit.

7. A semiconductor circuit according to claim 1, wherein said second bias circuit includes:
    a reference current generating circuit connected between a first power supply and a second power supply, and to said reference voltage generating circuit, the reference current generating circuit including the second reference load element and generating a reference current based on a resistance value of the second reference load element; and
    a current voltage converter connected between the first power supply and the second power supply, and to the reference current generating circuit, the current voltage converter converting the reference current to the second bias voltage.

8. A semiconductor circuit according to claim 7, wherein the reference current generating circuit includes:
    a voltage dividing circuit connected between the first power supply and the second power supply, the voltage dividing circuit outputting the divided voltage;
    a differential amplifier connected between the first power supply and the second power supply, and to the voltage dividing circuit and said reference voltage generating circuit, the differential amplifier outputs amplified voltage based on the reference voltage and the divided voltage; and
    a grounded source amplifier circuit connected between the first power supply and the second power supply, and to the differential amplifier, the grounded source amplifier circuit including the second reference load element and generating a second reference current based on a resistance value of the second reference load element.

9. A semiconductor circuit according to claim 1, wherein said second driver circuit is an operational amplifier having a non-inverting input terminal, an inverting input terminal, an bias input terminal connected to the second bias circuit and an output terminal connected to the second load element.

10. A semiconductor circuit according to claim 1, wherein the second reference load element is a polycrystal silicon resistor and the second material is polycrystal silicon.

11. A semiconductor circuit according to claim 7, wherein said second driver circuit and the current voltage converter have constant current transistors, respectively, and wherein the constant current transistors constitute a current mirror circuit.

12. A semiconductor circuit according to claim 1, further comprising:
    a third bias circuit connected to the reference voltage generating circuit, the third bias circuit having a third reference load element formed of a third material; and
    a third driver circuit connected to the third bias circuit, the third driver circuit driving a third load element formed of the third material based on the third bias voltage.

13. A semiconductor circuit according to claim 12, wherein the third reference load element is an external resistor and the third load element is another external resistor.

14. A semiconductor circuit comprising:
    a reference voltage generating circuit which outputs a reference voltage;
    a reference current generating circuit connected between the first power supply and the second power supply, and to said reference voltage generating circuit, the reference current generating circuit including a reference load element and generating a reference current based on a resistance value of the reference load element;

a first current voltage converter connected between the first power supply and the second power supply, and to the reference current generating circuit, the first current voltage converter converting the reference current to the first bias voltage;

a first driver circuit connected to the first current voltage converter, the first driver circuit driving a first load element based on the first bias voltage;

a second current voltage converter connected between the first power supply and the second power supply, and to the reference current generating circuit, the second current voltage converter converting the reference current to the second bias voltage;

a second driver circuit connected to the second current voltage converter, the second driver circuit driving a second load element based on the second bias voltage; and a control circuit connected to the first and second current voltage converters, the control circuit receiving a control signal and disabling at least one of the first and second current voltage converters in response to the control signal.

15. A semiconductor circuit according to claim 14, wherein the reference current generating circuit includes:

a voltage dividing circuit connected between the first power supply and the second power supply, the voltage dividing circuit outputting the divided voltage;

a differential amplifier connected between the first power supply and the second power supply, and to the voltage dividing circuit and said reference voltage generating circuit, the differential amplifier outputs amplified voltage based on the reference voltage and the divided voltage; and a grounded source amplifier circuit connected between the first power supply and the second power supply, and to the differential amplifier, the grounded source amplifier circuit including the reference load element and generating a reference current based on a resistance value of the reference load element.

16. A semiconductor circuit according to claim 14, wherein said first driver circuit is an operational amplifier having a non-inverting input terminal, an inverting input terminal, an bias input terminal connected to the first current voltage converter and an output terminal connected to the first load element.

17. A semiconductor circuit according to claim 14, wherein said second driver circuit is an operational amplifier having a non-inverting input terminal, an inverting input terminal, an bias input terminal connected to the second current voltage converter and an output terminal connected to the second load element.

18. A semiconductor circuit according to claim 14, wherein said first driver circuit and said first current voltage converter have constant current transistors, respectively, and wherein the constant current transistors constitute a current mirror circuit.

19. A semiconductor circuit according to claim 14, wherein said second driver circuit and said second current voltage converter have constant current transistors, respectively, and wherein the constant current transistors constitute a current mirror circuit.

* * * * *